(12) United States Patent
Schindler et al.

(10) Patent No.: US 8,338,843 B2
(45) Date of Patent: Dec. 25, 2012

(54) LIGHT-EMITTING DEVICE

(75) Inventors: Florian Schindler, Traunstein (DE);
Markus Klein, Tegernheim (DE);
Benjamin Claus Krummacher,
Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 131 days.

(21) Appl. No.: 12/442,366

(22) PCT Filed: Aug. 28, 2007

(86) PCT No.: PCT/DE2007/001534
§ 371 (c)(1),
(2), (4) Date: Jun. 5, 2009

(87) PCT Pub. No.: WO2008/034405
PCT Pub. Date: Mar. 27, 2008

(65) Prior Publication Data
US 2009/0261371 A1    Oct. 22, 2009

(30) Foreign Application Priority Data

Sep. 22, 2006 (DE) .......... 10 2006 044 852
Nov. 3, 2006 (DE) .......... 10 2006 052 029

(51) Int. Cl.
*H01L 33/00* (2010.01)
(52) U.S. Cl. ............ 257/98; 257/91; 257/92; 257/93; 257/99
(58) Field of Classification Search ............ 257/91, 257/92, 93, 98, 99
See application file for complete search history.

(56) References Cited

U.S. PATENT DOCUMENTS

| 6,222,207 B1* | 4/2001 | Carter-Coman et al. ....... 257/98 |
| 6,856,383 B1 | 2/2005 | Vachris et al. |
| 7,074,500 B2 | 7/2006 | Pfeiffer et al. |
| 2002/0075566 A1 | 6/2002 | Tutt et al. |
| 2002/0167267 A1* | 11/2002 | Sekiya ............ 313/500 |
| 2003/0133243 A1 | 7/2003 | Imamura |
| 2004/0206965 A1 | 10/2004 | Evans |
| 2005/0007000 A1 | 1/2005 | Chou et al. |
| 2005/0110388 A1 | 5/2005 | Takeuchi |
| 2005/0236614 A1 | 10/2005 | Parker |
| 2006/0180807 A1 | 8/2006 | Bechtel et al. |
| 2006/0231843 A1 | 10/2006 | Qin et al. |
| 2006/0273310 A1 | 12/2006 | Birnstock et al. |
| 2008/0197371 A1 | 8/2008 | Ottermann |
| 2009/0072711 A1 | 3/2009 | Cina et al. |

FOREIGN PATENT DOCUMENTS

| CN | 1625317 A | 6/2005 |
| CN | 1823431 A | 8/2006 |
| CN | 1969405 A | 5/2007 |
| DE | 100 58 578 A1 | 6/2002 |
| DE | 102 24 021 A1 | 12/2003 |
| DE | 102 55 933 A1 | 6/2004 |
| DE | 20 2005 000 979 U1 | 7/2006 |
| EP | 1 018 718 A1 | 7/2000 |
| EP | 1 729 346 A1 | 12/2006 |
| GB | 2 329 506 A | 3/1999 |

(Continued)

*Primary Examiner* — Tan N Tran
(74) *Attorney, Agent, or Firm* — Slater & Matsil, L.L.P.

(57) ABSTRACT

An embodiment of the invention concerns a light-emitting device with an adjustable, time-variable luminance. This is achieved through electrically conductive tracks that are applied to the first electrode area. The conductive tracks are driven in a time-variable manner with different levels of electrical power.

39 Claims, 11 Drawing Sheets

FOREIGN PATENT DOCUMENTS

| | | |
|---|---|---|
| JP | 04-000772 A | 1/1992 |
| JP | 2000-243572 A | 9/2000 |
| JP | 2000-294382 A | 10/2000 |
| JP | 2004-513483 A | 4/2004 |
| TW | 399394 B | 7/2000 |
| TW | I235983 B | 7/2005 |
| WO | WO 2005/008800 A1 | 1/2005 |
| WO | WO 2005/015640 A1 | 2/2005 |
| WO | WO 2005/048372 A1 | 5/2005 |
| WO | WO 2007/119200 A2 | 10/2007 |

* cited by examiner

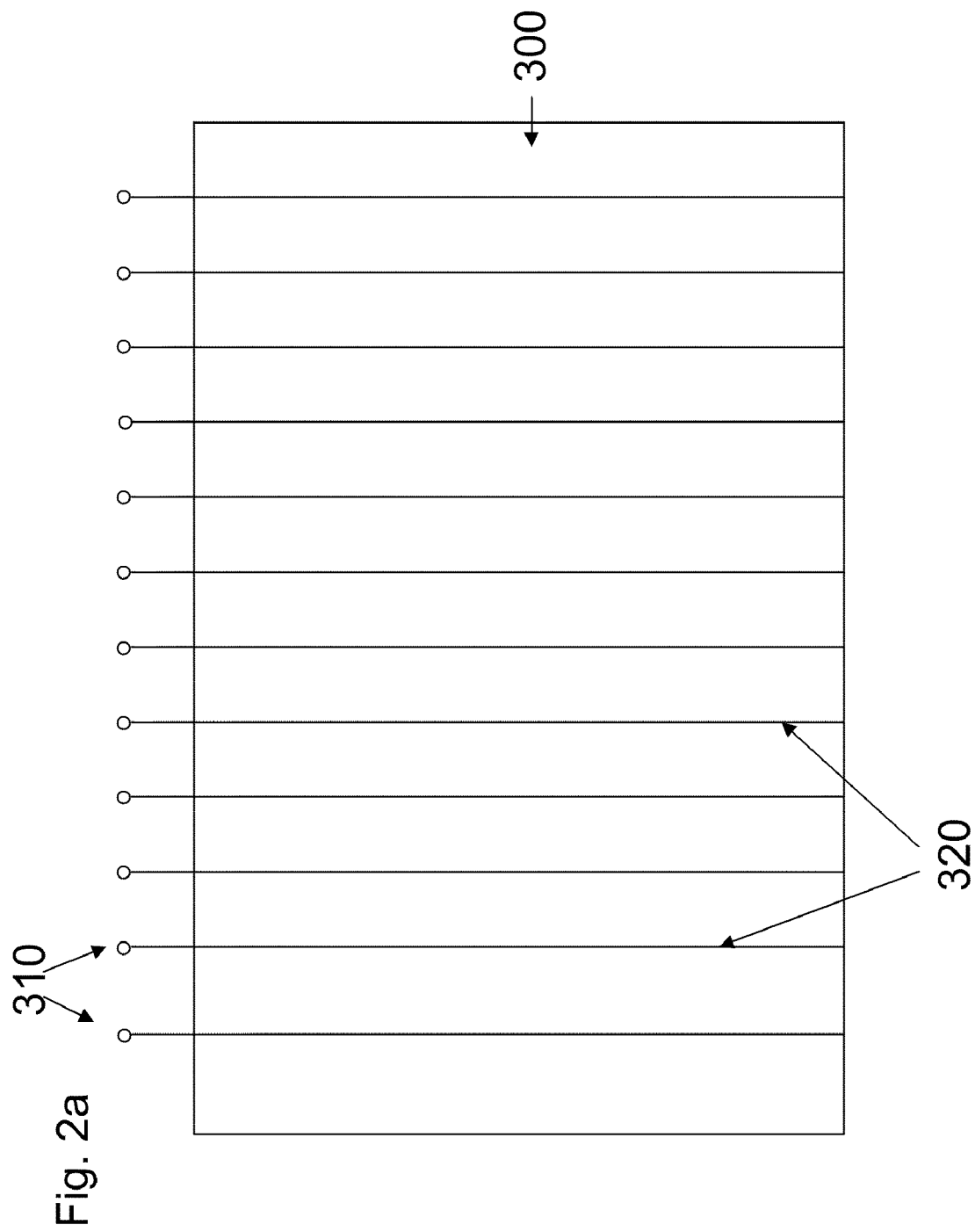

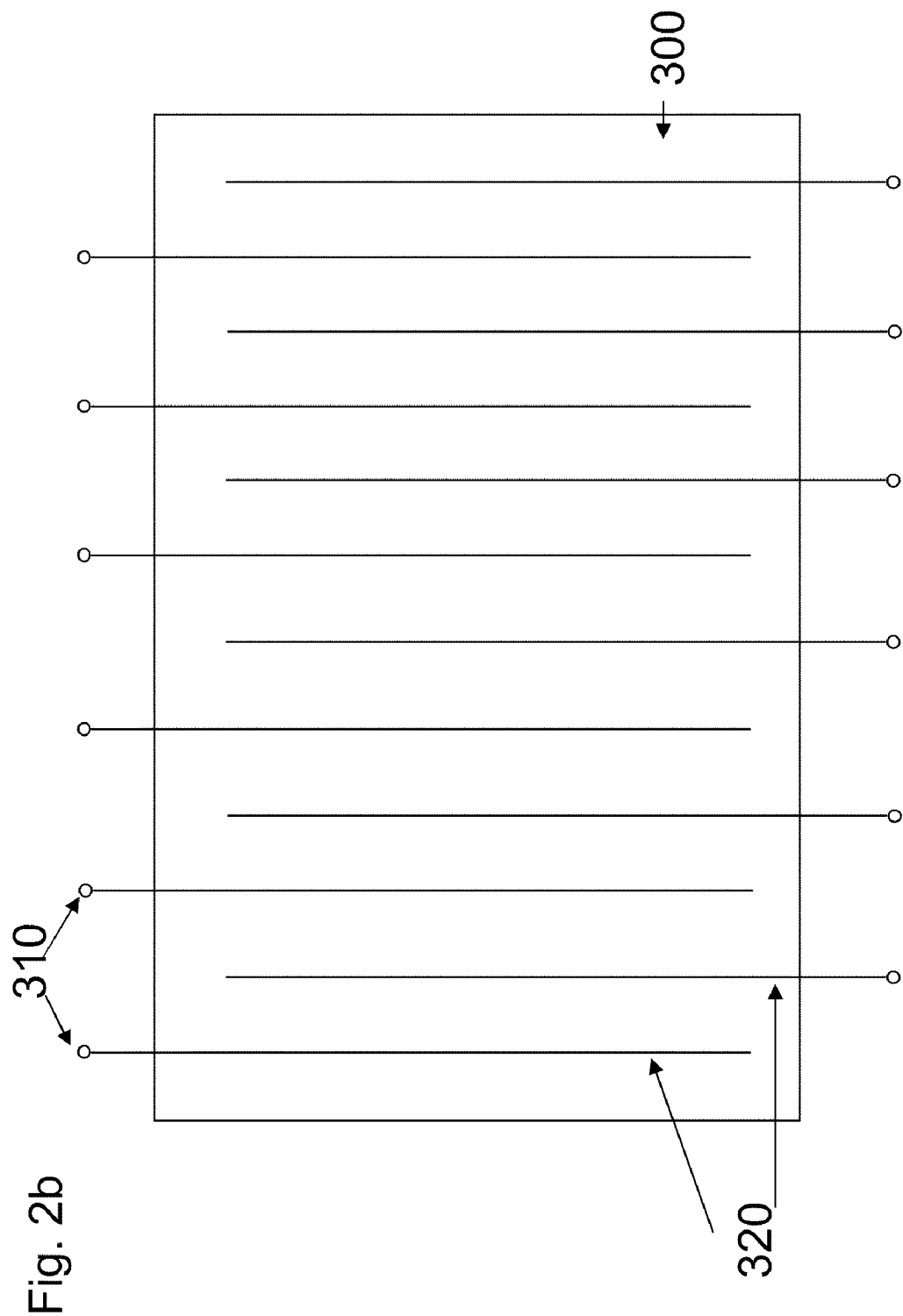

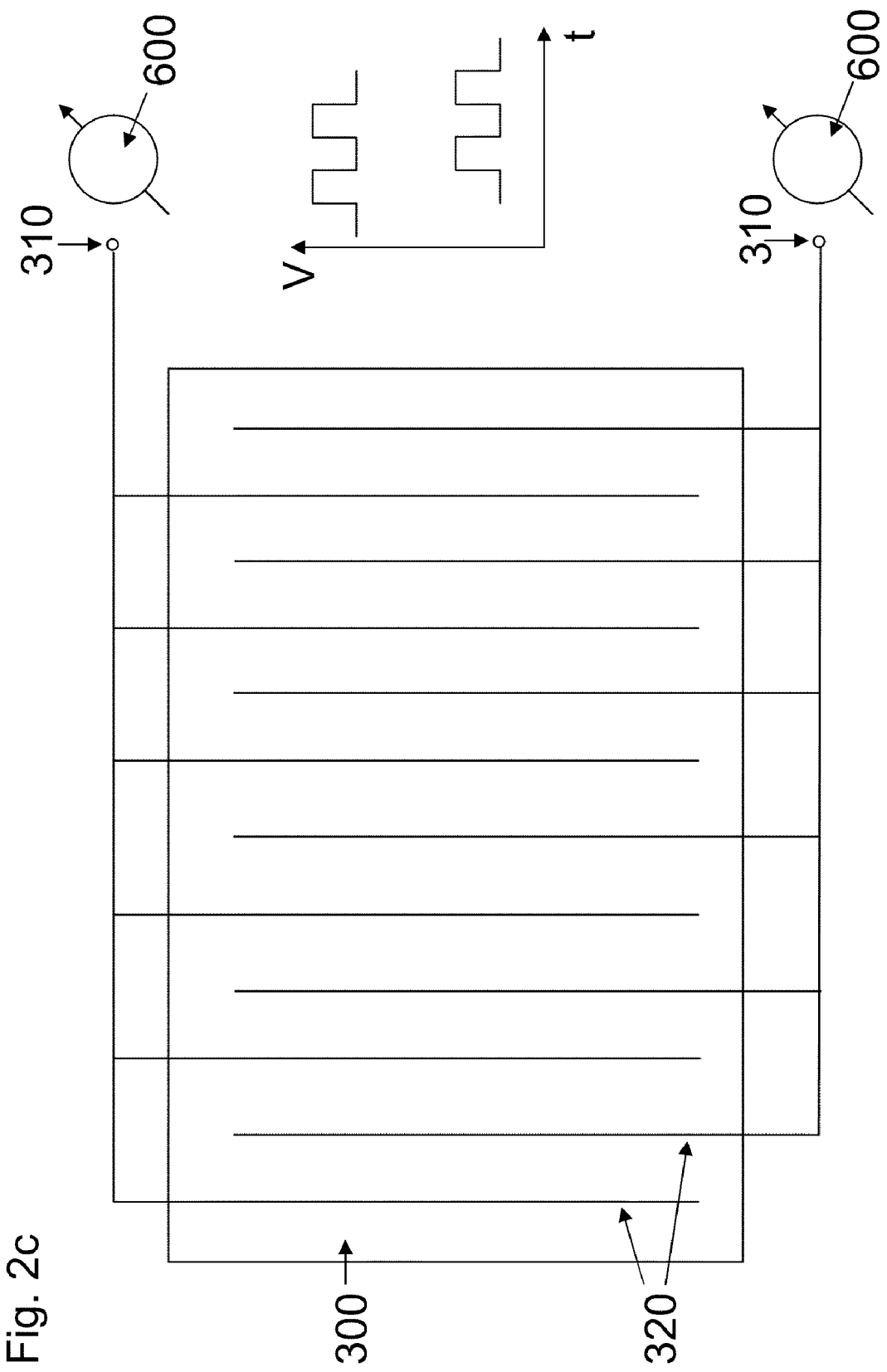

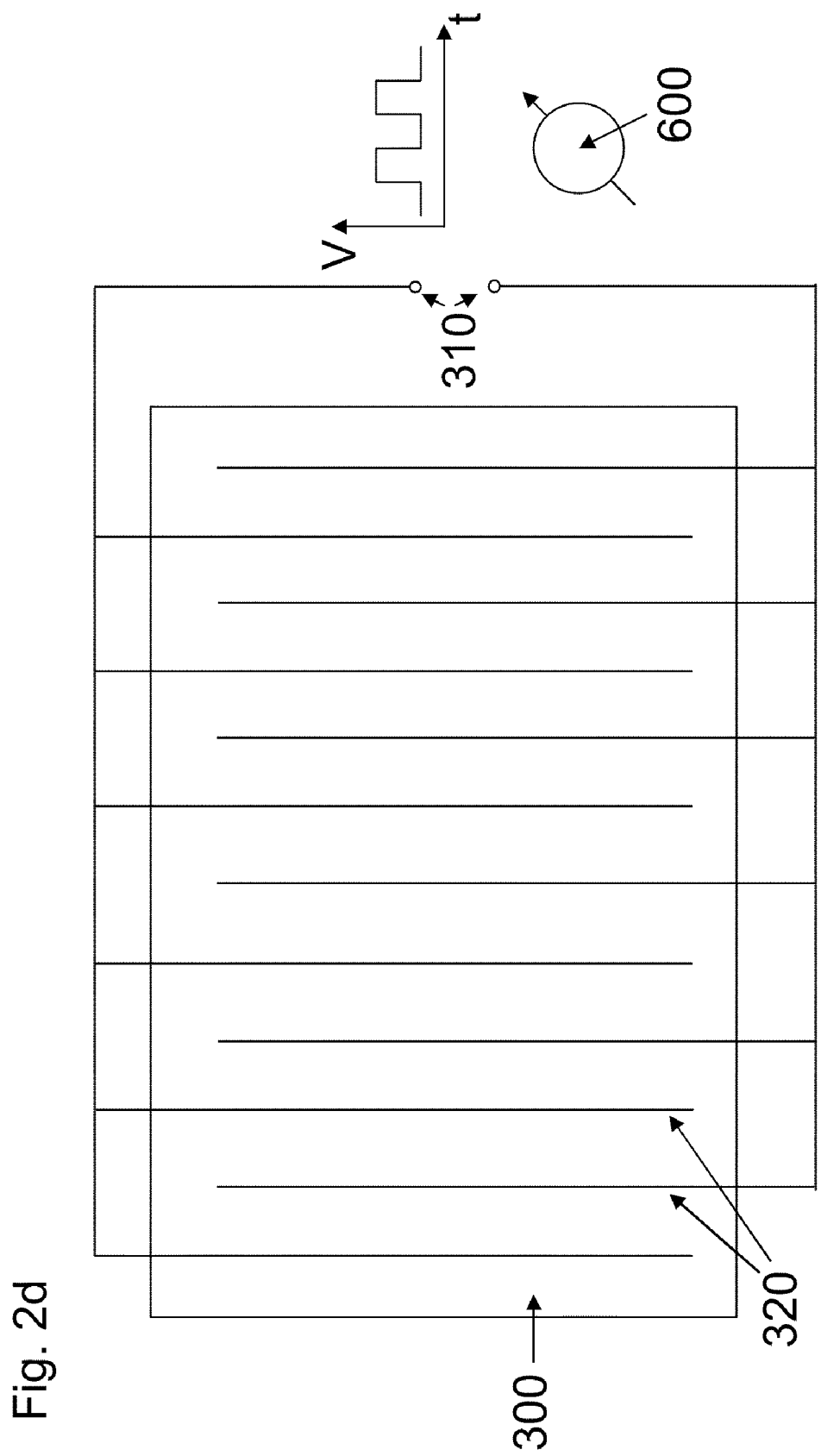

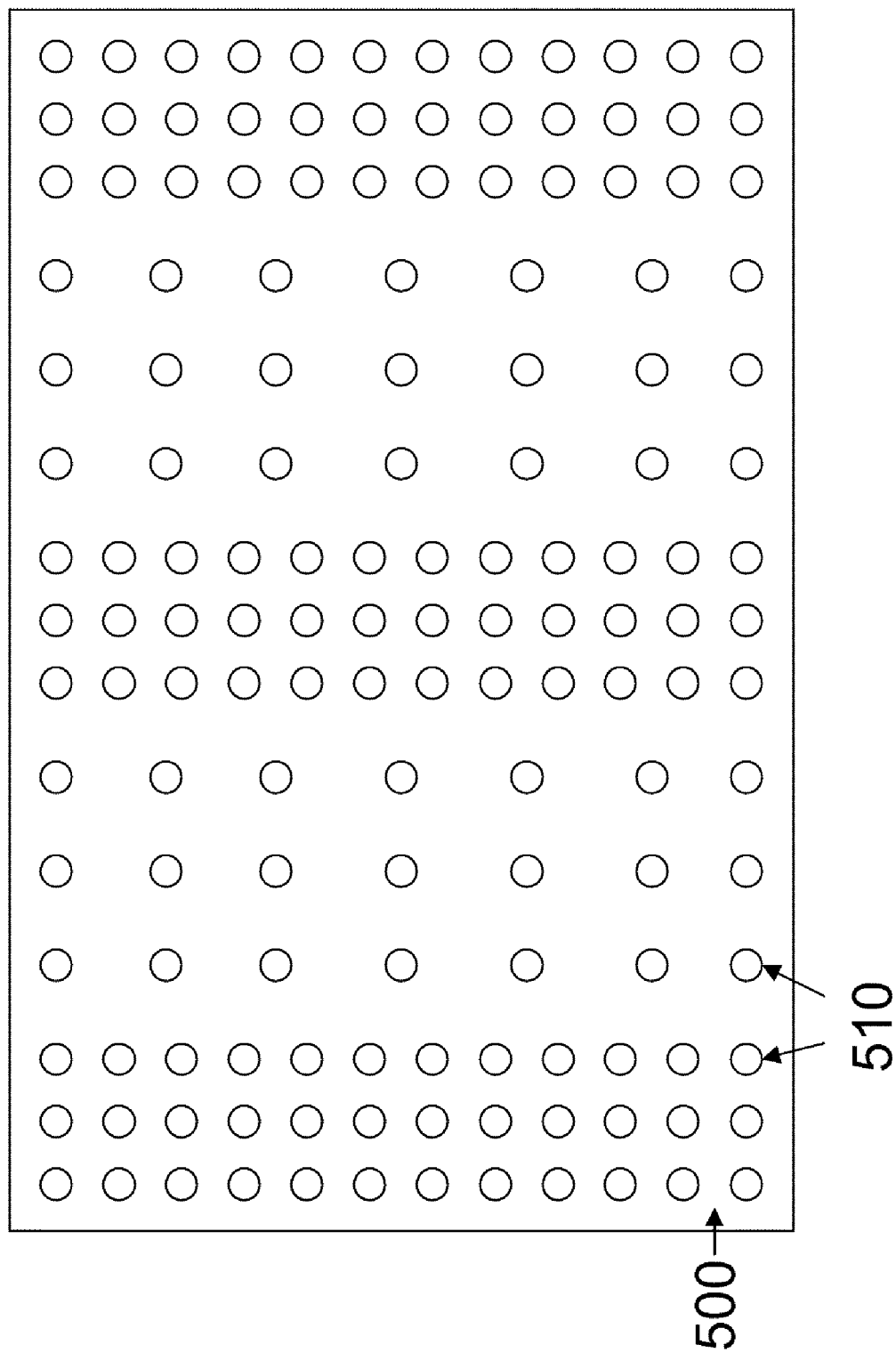

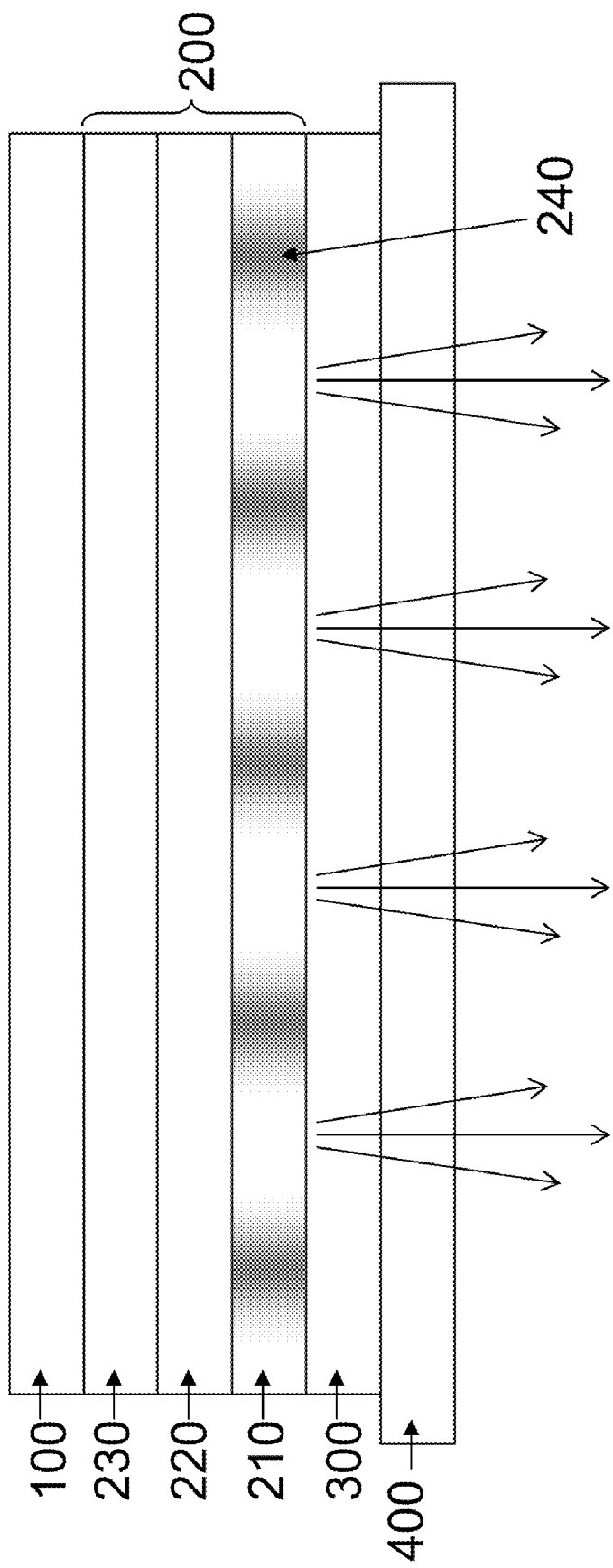

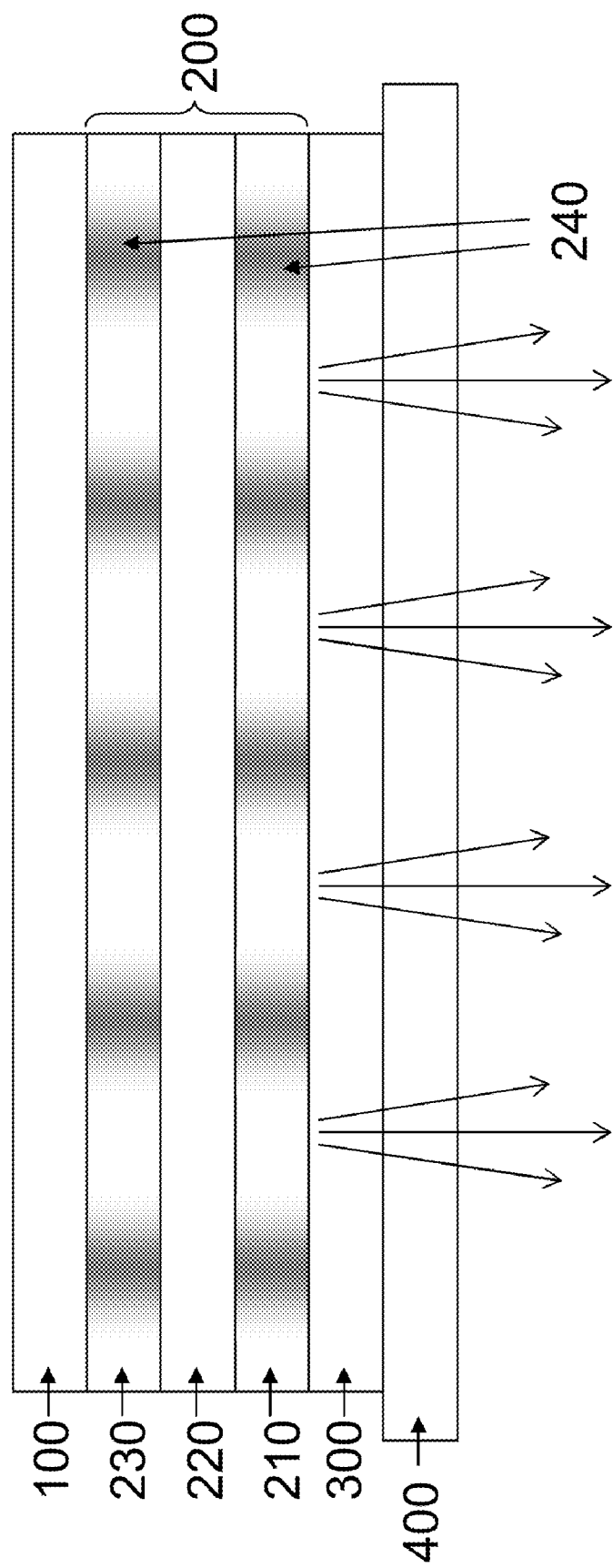

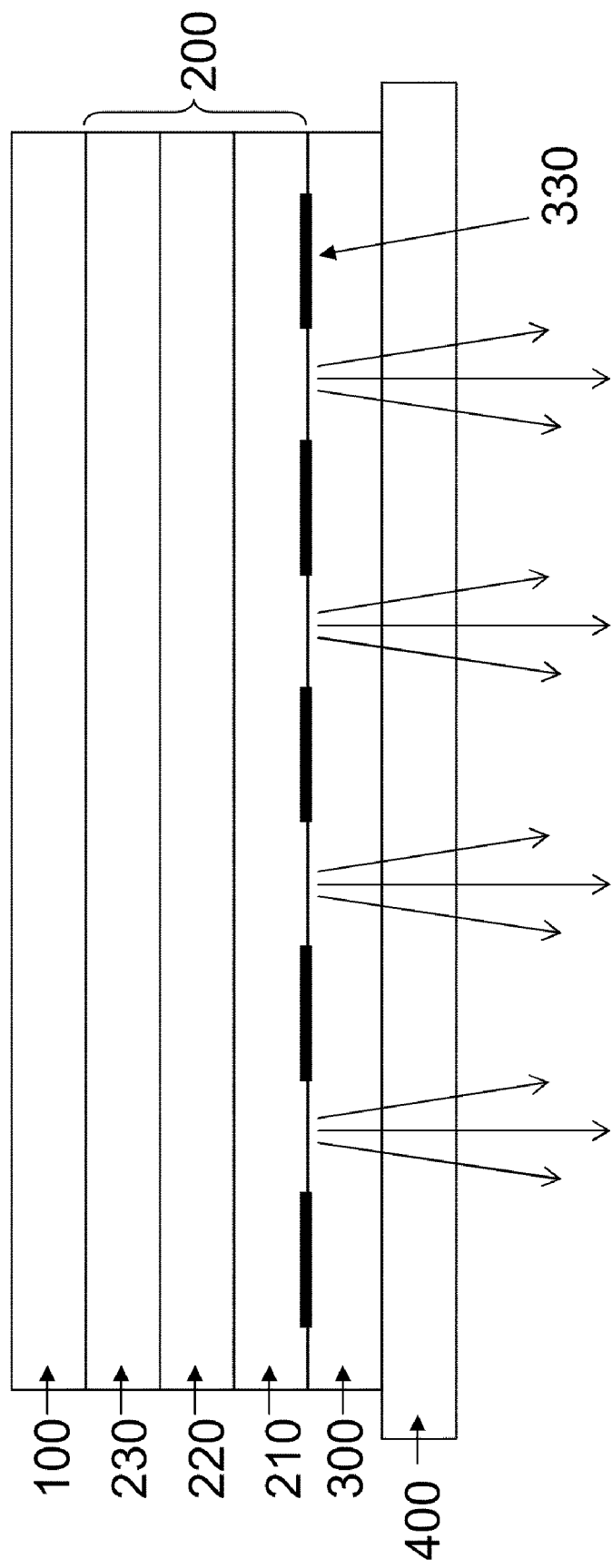

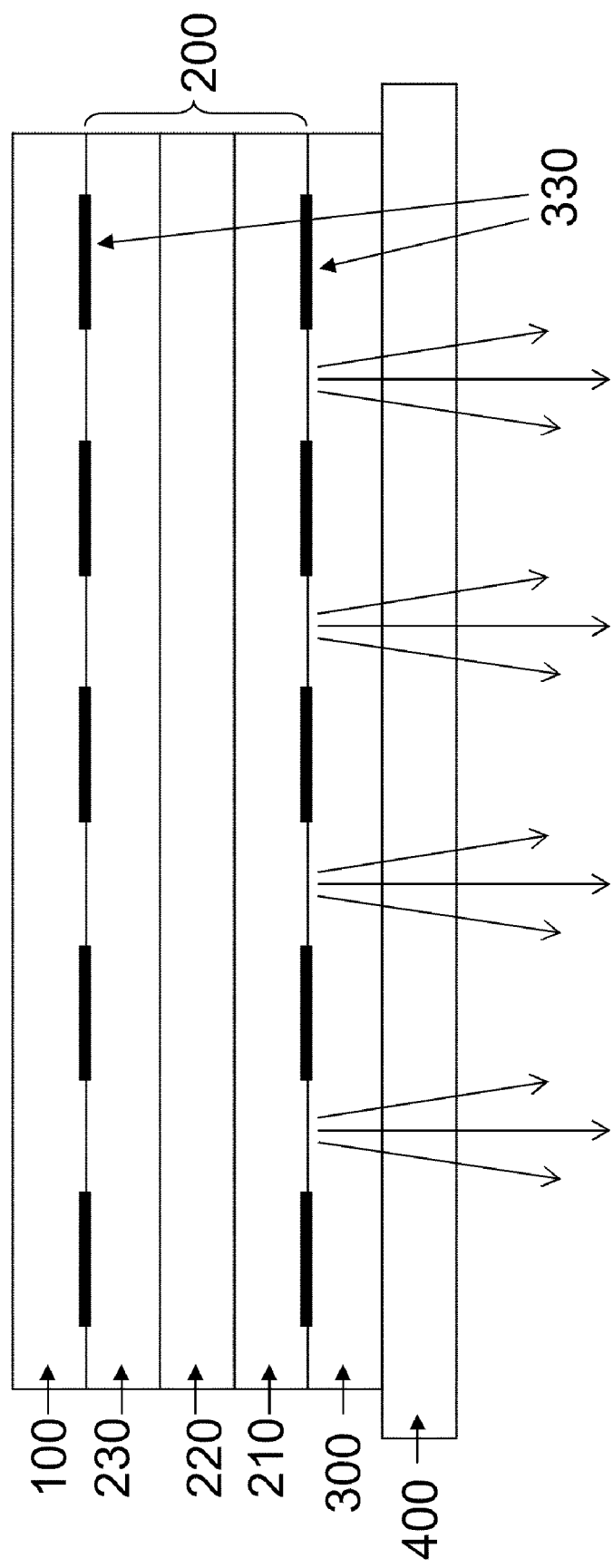

LIGHT-EMITTING DEVICE

This patent application claims the priority of the German Patent Applications 10 2006 044 852.9 filed Sep. 22, 2006 and 10 2006 052 029.7 filed Nov. 3, 2006; the content disclosed therein is hereby incorporated through this reference.

TECHNICAL FIELD

The invention concerns a light-emitting device with at least one functional light-emitting layer.

BACKGROUND

Light-emitting devices, such as an OLED (organic light emitting diode), for instance, exhibit, as a result of their planar structure, a two-dimensional radiation profile that generally obeys Lambert's law. It is possible, for instance, to assemble lighting units (panels) with large areas from such planar light-emitting devices. A homogeneous radiation surface can be confusing to the human eye, as spatial depth becomes lost and the light can create a monotonous impression.

The purpose of the invention is to provide methods for light-emitting devices that minimize the disadvantages mentioned above.

SUMMARY

In light-emitting devices according to one embodiment of the invention, electrically conductive tracks that make electrical contact with at least one electrode area are employed.

These electrically conductive tracks are combined with one electrode area of a light-emitting device, and are driven by electrical power that is time-variable and/or of different magnitudes. In this way a light-emitting device with an adjustable, time-variable luminance is obtained. This device incorporates a substrate onto which a first electrode area is applied. On top of this there are at least two electrically conductive tracks that are in electrical contact with the first electrode area. On top of the electrically conductive tracks there is at least one functional light-emitting layer, with a second electrode area on top. The at least two electrically conductive tracks are arranged here in such a way that they can be excited by time-variable and/or different magnitudes of electrical power, resulting in a variable luminance. Utilizing the pulse shape, gradient, magnitude and clocking of the applied electrical power, the existing non-linear dependency of the luminance can be used to lend a dynamic quality to the illumination. The individual electronic control permits adaptation to whatever degree of liveliness is wanted.

This liveliness or vitality of the illumination can be generated through local fluctuations of the brightness. The fluctuations can be generated in fixed positions, or may be dynamic. As a result, the eye can resolve the spatial depth and in addition the room lighting can be given a living quality.

For this light-emitting device with variable excitation, a favorable implementation of the invention may also involve an OLED, favorably a large-area OLED.

An OLED comprises a first and a second electrode area, which can be connected as a cathode and an anode, between which there is at least one organic functional layer which may, for instance, contain an emission layer, an electron layer and a hole transport layer. Electrons are injected from the cathode, and positive charges (holes) from the anode into the emission layer, when a voltage is applied. Light is created when these charges recombine in the emission layer.

Favorably, the at least two electrically conductive tracks are arranged on the electrode area with a spacing of between 5 µm and 10 cm, favorably between 500 µm and 1 cm, and possibly have different lengths. They can have separate electrical drives. For this purpose, in one favorable embodiment of the invention, the conductive tracks are electrically connected to a power source, where the output signal from the power source can be adjusted to an individual modulation frequency for each conductive track. This modulation frequency is advantageously less than 200 Hz, favorably under 100 Hz. A frequency and/or amplitude having static fluctuations is also conceivable.

According to a further development of the invention, the conductive tracks feature electrical connections for contacting a current source, wherein the connections can be positioned at different ends of the conductive tracks. In a further favorable embodiment of the invention, the conductive tracks are assembled into at least two groups, where the tracks in a group have electrically conductive connections to one another. In this case it is favorable if each group has an electrically conductive connection to a different current source, and if the output signals from the current sources can be modulated independently of one another. This allows the brightness of the groups to be modulated at different times. The groups can also have an electrically conductive connection to a common current source, whose output signal can be modulated. Flickering can be generated at a fixed location in this way. The advantage of this kind of implementation is that the contacts to the tracks can be made more easily when they are assembled into groups.

A further advantageous feature of a further embodiment of the invention involves the inclusion of an additional light outlet layer that contains a large number of optical elements, located in the radiation path of the functional light-emitting layer. The optical elements here are favorably located on a primary surface of the light outlet layer. The optical elements favorably have a distribution that varies across the surface and/or have different geometric shapes. They are favorably selected from a group consisting of lenses, prisms, cylinders, light-filtering units and scattering particles. Such a combination of a light outlet layer with a light-emitting device serves to generate a local, static variation in the brightness, since the planar light outlet layer has a spatially varying structure, and therefore, due to the varied structure and varying distribution of the optical elements across the surface, a local, static variation in the luminance can result. The chromaticity coordination can also be periodically modulated by the light outlet layer, for instance through the apex angle of the prism or through light-filtering units. This static variation in brightness can be combined with the dynamic variations that have been described above.

A further favorable feature of a favorable embodiment of the invention is the inclusion, in addition, of a first charge transport layer located between the first electrode area and the at least one functional light-emitting layers, and having partial regions with different electrical conductivities. This favorably takes the form of laterally alternating regions that alternately have higher and lower electrical conductivities. For this purpose the device includes a dopant whose distribution varies in the partial regions within the charge transport layer. The advantage of this feature is that a spatial modification of the doping leads to a local variation in the conductivity. In a favorable further development, a second charge transport layer can be located between the functional light-emitting layer and the second electrode area, wherein the second charge transport layer also features different partial regions with different conductivities. This favorably takes the form of laterally alternating regions that alternately have higher and lower electrical conductivities. The second charge transport layer again includes a dopant whose distribution varies across the partial regions within the charge transport layer. The first and second charge transport layers are selected to be electron transport layers or hole transport layers. The spatial variation in the doping results in a local variation in the conductivity and this, in turn, results in a local variation in the luminance. This contributes to the observer's perception of a more lively illumination or of a locally dependent variation in intensity.

Moreover, variations in the electrical conductivity of the surface of the first electrode in a lateral direction can also be a further feature of the invention. The surface of the first electrode here incorporates surface modifications that vary in a lateral direction. The advantage of this feature is that a local modification of the surface conductivity of the electrode has the result of a corresponding local variation in the density of charge carriers. Favorably it is also possible for the surface of the second electrode to feature varying electrical conductivity in a lateral direction, where this can be achieved through a surface modification that varies in a lateral direction. The lateral surface modifications can, for instance, be generated by local plasma treatment, leading to a locally modified charge carrier work function or to a locally modified surface resistance. The local variations in the charge carrier density on the surfaces of the electrodes have the effect of creating a laterally varying conductivity which, in turn, causes a laterally varying luminance that the observer perceives as a lively quality in the illumination. In this way, in addition to the dynamic variations in the luminance described above, a static variation in the luminance is also created.

According to a further embodiment, the invention also concerns a light-emitting device with a varying luminance that comprises a substrate, a first electrode area, at least one functional light-emitting layer, a second electrode area and a light outlet layer in the radiation path of the functional light-emitting layer. The light outlet layer here incorporates a large number of optical elements having a varying distribution across the surface and/or geometrical shape and/or optical transmissivity. Favorably the optical elements are selected from lenses, prisms, cylinders, light-filtering units and scattering particles, and are located on the primary surface or the surface through which the light emerges from the light outlet layer. Favorably this light-emitting device is comprised of an OLED. Such a combination of a light outlet layer with a light-emitting device serves to generate a local, static variation in the brightness, since the planar light outlet layer has a spatially varying structure, and therefore, due to the varied structure and varying distribution of the optical elements across the surface, a local, static variation in the luminance can result from the locally varying intensity of the radiation that is coupled outwards. The chromaticity coordination can also be periodically modulated by the light outlet layer, for instance through the apex angle of the prism or through light-filtering units.

The invention also concerns a light-emitting device that comprises a substrate, a first electrode area, a first charge transport layer, at least one functional light-emitting layer, and a second electrode area. The first charge transport layer here can feature partial regions of different electrical conductivity. This favorably takes the form here of laterally alternating regions that alternately have higher and lower electrical conductivities. Favorably the first charge transport layer includes a dopant whose distribution varies in the partial regions within the first charge transport layer. In a favorable further development of this feature, a second charge transport layer can be located between the at least one functional light-emitting layer and the second electrode area, and this can also feature partial regions with different electrical conductivity. This favorably takes the form of regions that alternate in a lateral direction, alternately having higher and lower electrical conductivities. The regions that alternate in a lateral direction incorporate a dopant whose distribution varies across the partial regions of the second charge transport layer. The advantage of this feature is that a spatial modification of the doping leads to a local variation in the conductivity. The distribution of the dopant favorably lies in the range of a few percent, favorably less than 15 percent of the maximum value of the dopant concentration. Favorably this light-emitting device incorporates an OLED.

A further embodiment of the invention concerns a light-emitting device with varying luminance, comprising a substrate, a first electrode area, at least one functional light-emitting layer and a second electrode area, wherein the first and/or the second electrode area has an electrical conductivity that varies in a lateral direction, or has a locally modified charge carrier work function. The surface of the first and/or second electrode areas here favorably feature surface modifications that vary in a lateral direction. Favorably the light-emitting device comprises an OLED. The local variations in the charge carrier density on the surfaces of the electrodes have the effect of creating a laterally varying conductivity which, in turn, causes a laterally varying luminance that the observer perceives as a lively quality in the illumination.

BRIEF DESCRIPTION OF THE DRAWINGS

The invention will be explained in more detail with the aid of the figures and with examples of the embodiments:

FIG. 1, show a cross-section through the structure of a light-emitting device.

FIGS. 2a to 2d show top views of the functional light-emitting layer with the conductive tracks that can be variably driven.

FIG. 3 shows a top view of the light outlet layer with optical elements.

FIGS. 4a to 4d show cross sections through various implementations of the light-emitting device, having layers with laterally varying electrical conductivity.

DETAILED DESCRIPTION

Figure 1A:
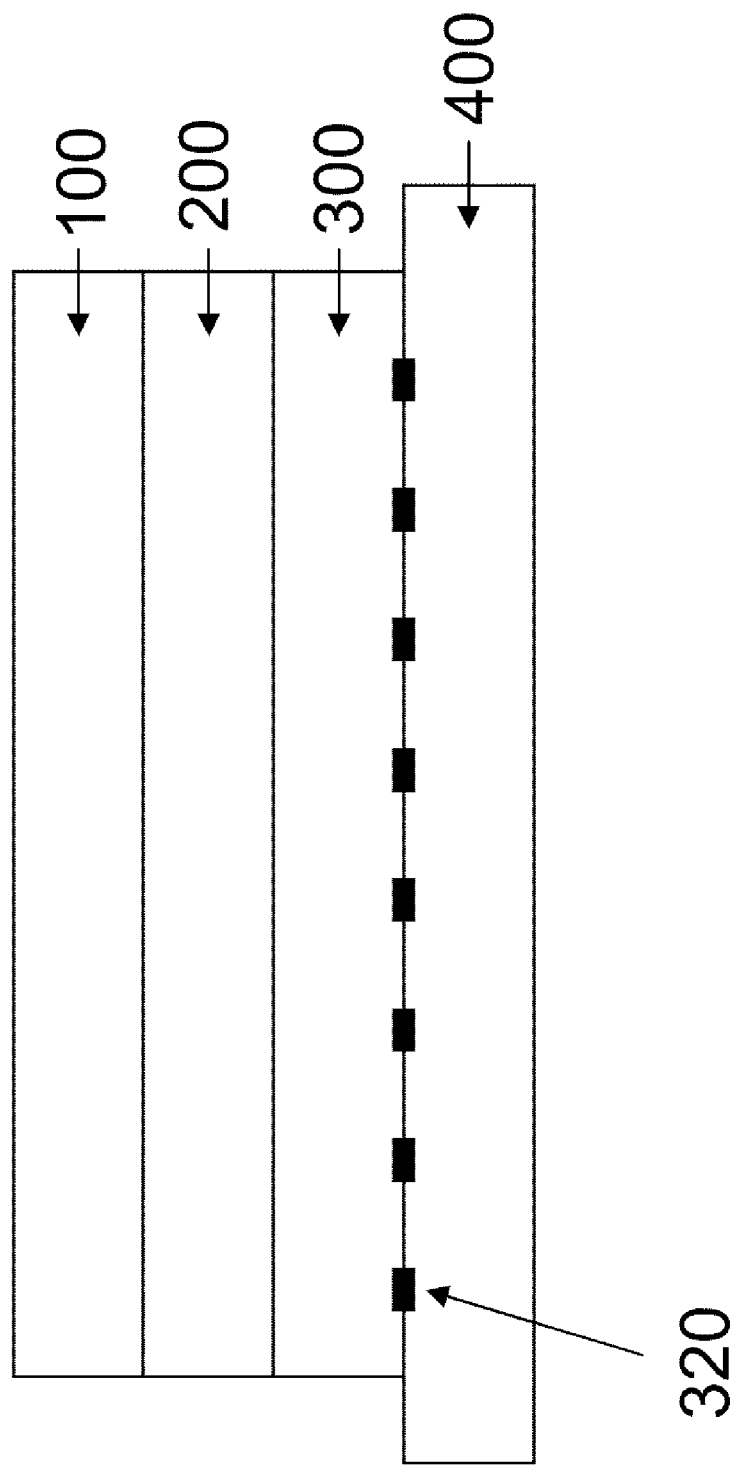
FIGS. 1a and 1b, collectively

FIG. 1a shows the cross-section of an embodiment of a device according to the invention. Here, a substrate (400) provides a base for electrically conductive tracks (320), on top of which there is a first electrode area (300), and on top of that at least one organic layer (200) and a second electrode area (100). The organic layer (200) can comprise functional light-emitting layers and/or charge transport layers. When a voltage is applied to the tracks (320), they locally increase the conductivity of the first electrode area (300).

Figure 1B:
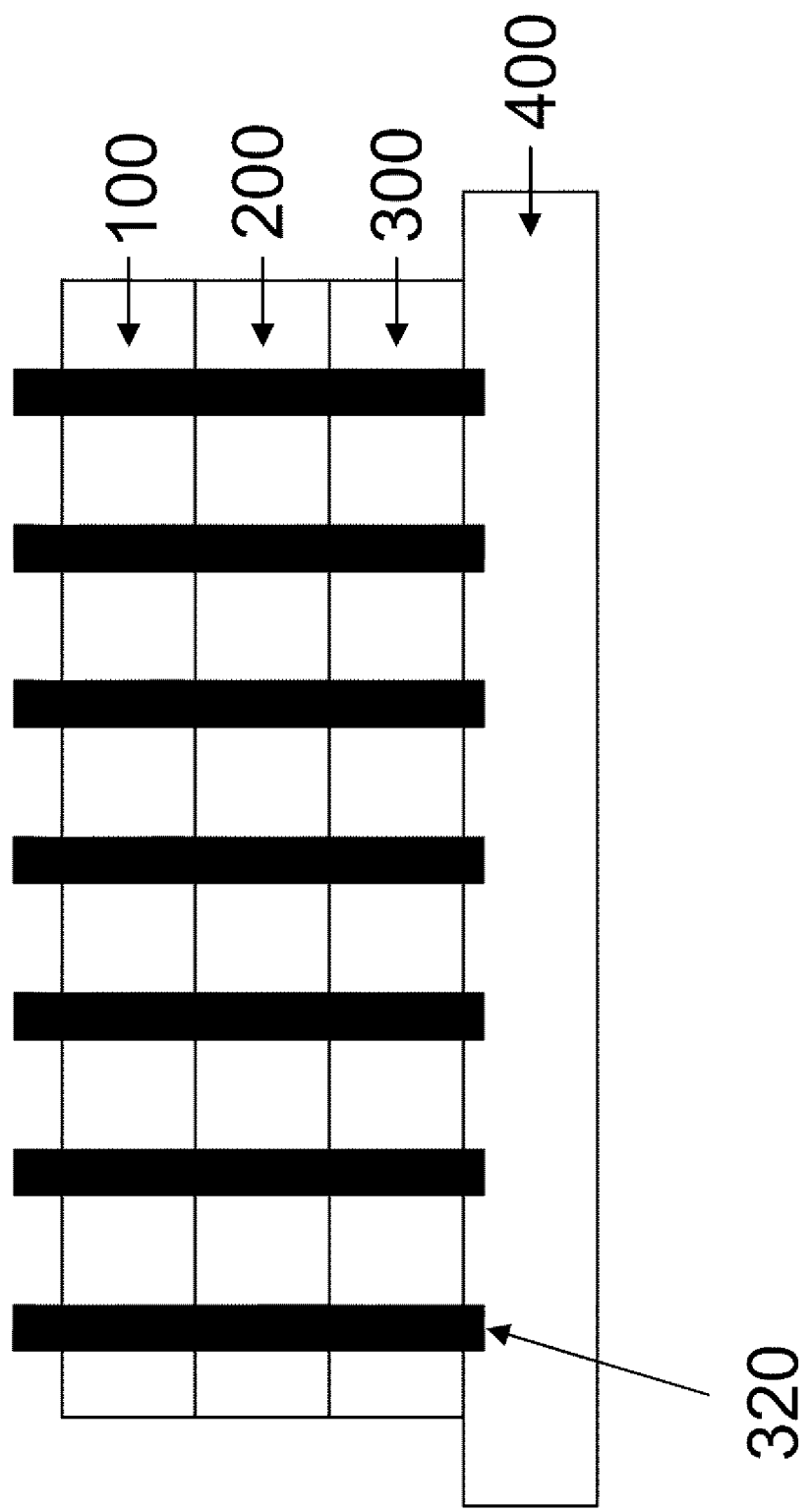

FIG. 1b illustrates a variation of the embodiment shown in FIG. 1a. The tracks (320) here are thick enough that they penetrate through the first electrode area (300), the organic layer (200) and the second electrode area (100). In this embodiment, the tracks (320) favorably are surrounded at the lateral edges to the organic layer (200) and to the second electrode area (100) by an insulating layer, for instance a non-conductive polymer layer. In general, the conductive tracks (320) may have variable thickness, and may be present at one of the surfaces of the first electrode area (300), in the first electrode area or may protrude past the thickness of the first electrode area (300).

FIG. 2a shows a view from above of the first electrode area (300) from FIG. 1, onto which conductive electrical tracks (320) with their electrical terminals (310) are applied. The conductive tracks (320) may be located on the surface of the electrode area, within the electrode area, or may protrude above the thickness of the first electrode area (300). In particular, they may be located between the substrate (400) and the first electrode area (300), as shown in FIG. 1, or may be between the first electrode area (300) and the at least one organic functional layer (200). The material of the conductive tracks (320) may comprise electrically conductive metals. The conductive tracks (320) are favorably arranged with a spacing of from 500 μm up to 1 cm between them, and may have different lengths; this means that they do not have to extend over the entire surface of the electrode area, but can, however, favorably be as long as possible. Each of these conductive tracks (320) has its own electrical connection, so that they can be excited individually. The modulation frequency, however, should not exceed 100 Hz, in order to create an effect that is visible to the external observer. Through the individual, variable drive of the conductive tracks (320), illumination is generated that has a dynamic effect and that can be adjusted for the desired liveliness.

FIG. 2b also shows a view from above of the first electrode area (300), onto which conductive electrical tracks (320) with their electrical terminals (310) are applied. This electrode area can, for instance, be used as the first electrode area (300) in the device of FIG. 1 in the place of the electrode area shown in FIG. 2a, or parts of the conductive tracks (320) shown in FIG. 2b can be combined with parts of the conductive tracks (320) shown in FIG. 2a in one electrode area. In this further favorable embodiment of the invention, the conductive tracks (320) with the terminals (310) that are associated with each are arranged in such a way that the terminals (310) are located in alternation on both sides of the electrode area. This embodiment is advantageous, as the connection of the tracks (320) to the electrical power source is simplified.

FIG. 2c shows a view from above of the first electrode area (300) from FIG. 1, which might, for instance, be used in the device of FIG. 1 as an electrode area, onto which conductive electrical tracks (320) with electrical terminals (310) are applied. The conductive tracks (320) may be located on the surface of the electrode area, within the electrode area, or may protrude above the first electrode area (300). In particular, they may be located between the substrate (400) and the first electrode area (300), as shown in FIG. 1, or may be between the first electrode area (300) and the at least one organic functional layer (200). In this further favorable embodiment of the invention, the conductive tracks (320) are assembled on the electrode area (300) in groups that have an electrically conductive connection between their members. As shown in FIG. 2c, the at least two groups can, for instance, be interleaved in the pattern of a comb. Each group has its own common electrical connection (310) for all the tracks in the group, driven by a source of electrical power (600). By applying a voltage V that depends upon the time t, it is possible to drive each group of tracks with pulsed signals, where the pulse shape, gradient, magnitude and the clocking of the applied voltages exploit the non-linear dependency of the luminance to create a dynamic lighting effect.

FIG. 2d illustrates a further favorable embodiment of an electrode area with conductive tracks (320). This diagram shows a view from above of a further embodiment of the first electrode area (300) of the device of FIG. 1, where electrically conductive tracks (320) and electrical terminals (310) can be seen, again forming two groups of conductive tracks (320), positioned on the first electrode area (300) and interleaved in the manner of a comb. Each of the groups of conductive tracks (320) is joined in an electrically conductive manner, while their terminals (310) in this embodiment are, however, connected to a single electrical power source (600). Here again, a pulsed voltage V depending on time t is applied; it can be changed in variable ways over time, so resulting in a dynamic brightness effect.

The different embodiments of electrode areas illustrated in FIGS. 2a to 2d may also, for instance, be combined in one device, so that, for instance, one of the electrode areas illustrated in these figures constitutes the first electrode area (300), and another of the electrode areas illustrated in the figures constitutes the second electrode area (100) of the device. Furthermore, these different embodiments can also be combined in a single electrode area.

FIG. 3 illustrates an example of passive modulation of the luminance. A view from above of a light outlet layer (500) that favorably is located in the radiation path of the light-emitting layer (220) and that contains a large number of optical elements (510), is shown. This layer (500) can, in FIG. 1 for instance, be located on the primary surface of the substrate (400) that faces away from the functional layer (200) in a "bottom-emitting" configuration, or may, for instance, be on an encapsulation of the sequence of layers (100), (200) and (300), not shown in FIG. 1, in a "top-emitting" configuration. These optical elements are located on the light exit surface of the light outlet layer (500), and have a lateral distribution across the surface. Their geometrical shaping can also have some distribution. The optical elements include lenses, prisms, cylinders and scattering particles, or any combination of these. In addition to normal lenses, the use of Fresnel lenses is also feasible. Geometrical variation of the scattering particles, which may, for instance, consist of plastic, of $TiO_2$ particles or of light-absorbing material, can be achieved through, for instance repeated printing or blade coating of different solutions of particles having the desired geometries onto a light-emitting device through suitable masks. This arrangement achieves a localized, static variation of brightness, as the light outlet layer (500) is strongly structured. The chromaticity coordination can also be periodically modulated, for instance through the apex angle of a prism. Both the density of the distribution and the variation in geometry can be implemented in one or two dimensions along the width and length of the light outlet layer (500); variations in this distribution can extend over ranges from a few centimeters up to a number of meters. The optical elements illustrated in FIG. 3 are schematically illustrated lenses that have a different lateral distribution across the surface. Alternatively, or in addition, it is also possible for other optical elements to be present on the light outlet layer (500).

FIG. 4a shows a cross-section through a light-emitting device, such as an OLED, in which a first electrode area (300), a first charge transport layer (210), a functional light-emitting layer (220), a second charge transport layer (230) and a second electrode area (100) are located on top of a substrate (400). In this case, the first (210) and second (230) charge transport layers and the functional light-emitting layer (220) may be part of the sequence of organic layers (200). The first charge transport layer incorporates a dopant (240) whose density varies laterally. Through this local variation in the degree of doping, a laterally varying conductivity is generated in the first charge transport layer (210), leading to a modification in the brightness. The variation in the intensity of the doping can, for instance, be achieved through vapor deposition using shadow masks. The range of variability in the doping extends to a few percent of the maximum value of the doping concentration; this, in turn, is typically less than 10 percent by volume of the charge transport layer.

FIG. 4b shows a further favorable form of this embodiment. Here the second charge transport layer (230) also incorporates a dopant (240) having a spatial variation that leads to a local variation in the conductivity and therefore in the brightness.

FIG. 4c illustrates a further implementation of the invention. A cross-section through a light-emitting device can again be seen, in which the surface of the first electrode area (300) features lateral surface modification (330). This can, for instance, be a structured layer of photoresist that is applied to the electrode surface. In consequence, the density of charge carriers injected into the at least one functional layer when a voltage is applied varies locally. The surface modification can, for instance, be achieved through a lithographic process, such as plasma etching of the electrode area. The surface modification creates local modification of the injection of the charge carriers, and thereby causes a local variation in the charge carrier density. This, in turn, modifies the charge carrier recombination, and thereby the brightness.

FIG. 4d shows a further variation of the invention described in FIG. 4c. Here, the surface of the second electrode area (100) also features surface modifications (330), which also leads to a modification of the surface conductivity and thereby to a locally varying injection of charge carriers when a voltage is applied.

The modification of the conductivity in the volume or on the electrode, as is proposed in FIGS. 4a to 4d, is lateral, and can be expected to extend over magnitudes of a few centimeters up to several tens of centimeters.

The examples illustrated in FIGS. 1 to 4 can also be varied or combined in any way for application in a light-emitting device. It must also be noted that the invention is not restricted to these examples, but permits additional implementations not described here.

The invention claimed is:

1. A light-emitting device having temporally and/or locally variable, adjustable luminance, the device comprising:
    a substrate,
    a first electrode area on the substrate,
    at least two electrically conductive tracks that are in electrical contact with the first electrode area,
    at least one functional light-emitting layer on the first electrode area, and
    a second electrode area on the functional light-emitting layer,
    wherein the at least two conductive tracks are arranged in such a way that the at least two tracks are excited by time-variable and/or locally variable and/or different magnitudes of electrical current, thereby resulting in a varying luminance and wherein the at least two conductive tracks are separately electrically driven.

2. The device according to claim 1, wherein the at least two conductive tracks are arranged in such a way that they are excited by time-variable and/or different magnitudes of electrical current, thereby resulting in a varying luminance.

3. The device according to claim 1, wherein the conductive tracks are arranged on the first electrode surface with a spacing of between 5 μm to 10 cm from one another and have different lengths.

4. The device according to claim 1, further comprising at least one electrical power source that has an electrically conductive connection to the conductive tracks, wherein the output signal from the electrical power source can be adjusted to an individual modulation frequency for the at least two conductive tracks.

5. The device according to claim 1, wherein an individual modulation frequency for each of the at least two conductive tracks is less than 200 Hz.

6. The device according to claim 1, wherein the conductive tracks have electrical terminals for contacting an electrical power source, and these electrical terminals are at different ends of the conductive tracks.

7. The device according to claim 1, having at least a first and a second group of electrically conductive tracks, wherein the conductive tracks in a group have electrically conductive connections to one another, a first conductor track of the at least two conductor tracks within the first group and a second conductor track of the at least two conductor tracks within the second group.

8. The device according to claim 7, wherein each of the at least two groups of conductive tracks has an electrically conductive connection to another electrical power source, wherein the output signals from the electrical power sources can be modulated independently of one another.

9. The device according to claim 7, wherein the at least two groups of conductive tracks have an electrically conductive connection to a common electrical power source, whose output signal can be modulated.

10. The device according to claim 1, wherein the light-emitting device comprises an OLED.

11. The device according to claim 1, further comprising a light outlet layer, having a number of optical elements in the radiation path of the functional light-emitting layer.

12. The device according to claim 11, wherein the optical elements are located on a primary surface of the light outlet layer, and where the optical elements have a distribution density and/or geometrical shape that varies across the surface.

13. The device according to claim 11, wherein the optical elements comprise optical elements selected from the group consisting of: lenses, prisms, cylinders, light-filtering units and scattering particles.

14. The device according to claim 1, further comprising a first charge transport layer between the first electrode area and the at least one functional light-emitting layer, wherein the first charge transport layer has partial regions having different electrical conductivities.

15. The device according to claim 14, wherein the first charge transport layer incorporates regions that alternate in a lateral direction and which alternately feature higher and lower conductivities.

16. The device according to claim 14, wherein the first charge transport layer incorporates a dopant, whose distribution within the partial regions of the charge transport layer varies.

17. The device according to claim 14, further comprising a second charge transport layer between the at least one functional light-emitting layer and the second electrode area, wherein the second charge transport layer has partial regions having different electrical conductivities.

18. The device according to claim 17, wherein the second charge transport layer incorporates regions that alternate in a lateral direction and which alternately feature higher and lower conductivities.

19. The device according to claim 17, wherein the second charge transport layer incorporates a dopant whose distribution within the partial regions of the charge transport layer varies.

20. The device according to claim 1, wherein, in addition, the surface of the first electrode area has an electrical conductivity that varies in a lateral direction.

21. The device according to claim 1, wherein the surface of the first electrode area has surface modifications that vary in a lateral direction.

22. The device according to claim 1, wherein, in addition, the surface of the second electrode area has an electrical conductivity that varies in a lateral direction.

23. The device according to the claim 22, wherein the surface of the second electrode area has surface modifications that vary in a lateral direction.

24. A light-emitting device having varying luminance, the device comprising:
- a substrate,
- a first electrode area on the substrate,
- at least one functional light-emitting layer on the first electrode area, and
- a second electrode area on the functional light-emitting layer,
- wherein the first and/or the second electrode area features an electrical conductivity that varies in a lateral direction and wherein the surface of the first electrode area facing away from the substrate has surface modifications that vary in a lateral direction.

25. The device according to claim 24, wherein the surface of the first electrode area and/or of the second electrode area has surface modifications that vary in a lateral direction.

26. The device according to claim 24, wherein the light-emitting device comprises an OLED.

27. A light-emitting device having temporally and/or locally variable, adjustable luminance, the device comprising:
- a substrate,
- a first electrode area on the substrate,
- at least two electrically conductive tracks that are in electrical contact with the first electrode area,
- at least one functional light-emitting layer on the first electrode area,
- a second electrode area on the functional light-emitting layer, and
- a driver circuit coupled to the at least two conductive tracks and separately electrically drive each of the at least two conductive tracks in such a way that the at least two tracks are excited by time-variable and/or locally variable and/or different magnitudes of electrical current, thereby resulting in a varying luminance.

28. The device according to claim 27, wherein the at least two conductive tracks are arranged in such a way that they can be excited by time-variable and/or different magnitudes of electrical current, thereby resulting in a varying luminance.

29. The device according to claim 27, wherein the conductive tracks are arranged on the first electrode surface with a spacing of between 5 µm to 10 cm from one another and have different lengths.

30. The device according to claim 27, wherein an individual modulation frequency for each of the at least two conductive tracks is less than 200 Hz.

31. The device according to claim 27, wherein the conductive tracks have electrical terminals for contacting an electrical power source, and these electrical terminals are at different ends of the conductive tracks.

32. The device according to claim 27, wherein the light-emitting device comprises an OLED.

33. The device according to claim 27, further comprising a light outlet layer, having a number of optical elements in the radiation path of the functional light-emitting layer.

34. The device according to claim 27, wherein the surface of the first electrode area has surface modifications that vary in a lateral direction.

35. The device according to claim 27, wherein, in addition, the surface of the second electrode area has an electrical conductivity that varies in a lateral direction.

36. A method of operating a light-emitting device, the device comprising a substrate, a first electrode area on the substrate, at least two electrically conductive tracks that are in electrical contact with the first electrode area, at least one functional light-emitting layer on the first electrode area, and a second electrode area on the functional light-emitting layer, the method comprising:
- exciting the at least two tracks are by time-variable and/or locally variable and/or different magnitudes of electrical current, thereby resulting in a varying luminance.

37. The method according to claim 36, wherein the at least two conductive tracks are separately electrically driven.

38. The method according to claim 36, wherein exciting the at least two tracks comprises exciting by time-variable and/or different magnitudes of electrical current, thereby resulting in a varying luminance.

39. The method according to claim 36, wherein an individual modulation frequency for each of the at least two conductive tracks is less than 200 Hz.

* * * * *